United States Patent
Kato et al.

(10) Patent No.: US 6,855,191 B2
(45) Date of Patent: Feb. 15, 2005

(54) ELECTROLESS GOLD PLATING SOLUTION

(75) Inventors: Masaru Kato, Saitama (JP); Ryota Iwai, Saitama (JP)

(73) Assignee: Kanto Kagaku Kabushiki Kaisha, Tokyo (JP)

( * ) Notice: Subject to any disclaimer, the term of this patent is extended or adjusted under 35 U.S.C. 154(b) by 49 days.

(21) Appl. No.: 10/353,460

(22) Filed: Jan. 29, 2003

(65) Prior Publication Data

US 2003/0150353 A1 Aug. 14, 2003

(30) Foreign Application Priority Data

Jan. 30, 2002 (JP) ........................................ 2002-021028

(51) Int. Cl.[7] .............................. C23C 18/52; B22F 7/00
(52) U.S. Cl. .................... 106/1.23; 106/1.26; 427/443.1
(58) Field of Search ............................ 106/1.23, 1.26; 427/443.1

(56) References Cited

U.S. PATENT DOCUMENTS

| | | | |
|---|---|---|---|
| 4,863,766 A | | 9/1989 | Iacovangelo et al. |
| 4,979,988 A | | 12/1990 | Iacovangelo |
| 5,470,381 A | * | 11/1995 | Kato et al. ................. 106/1.23 |
| 6,383,269 B1 | * | 5/2002 | Toben et al. ............... 106/1.23 |
| 6,398,856 B1 | * | 6/2002 | Nakazawa ................. 106/1.26 |
| 2003/0047108 A1 | * | 3/2003 | Hayashi et al. ............ 106/1.23 |
| 2004/0028833 A1 | * | 2/2004 | Takahashi et al. ........ 427/443.1 |

FOREIGN PATENT DOCUMENTS

JP     2001-185836 A     7/2001

OTHER PUBLICATIONS

Bedetti, F.V., et al., "Porosity testing of electroplated gold in gelled media." Plating. 53:305–308 (1966), no month.

Hasegawa, K., et al., "Electroless gold plating for semiconductor package substrate." 1997 IEMT/IMC Proceedings, pp. 230–233 (1997), no month.

Hyomen Jissou Gijutsu (Surface Mounting Technology) 5(11):52–56 (1995). Abridged English translation of pp. 53–55, no month.

Iacovangelo, C.D., "Autocatalytic electroless gold deposition using hydrazine and dimethylamine borane as reducing agents." J. Electrochem. Soc. 138(4):976–982. (1991), no month.

* cited by examiner

*Primary Examiner*—Helene Klemanski
(74) *Attorney, Agent, or Firm*—Wolf, Greenfield & Sacks, P.C.

(57) ABSTRACT

An electroless gold plating solution is provided in which an amount of gold deposited by a displacement reaction is at least 15 $\mu g/cm^2$, and the electroless gold plating solution includes a reducing agent that is oxidized by gold, and a reducing agent that is of the same type as or is a different type from the above reducing agent and is oxidized by a substrate metal. The solution can form a uniform gold coating having good adhesion and low porosity in one step.

11 Claims, 1 Drawing Sheet

Change in displacement reaction ratio with $NH_2OH \cdot HCl$ concentration

Fig.1

Change in displacement reaction ratio with $NH_2OH \cdot HCl$ concentration

Fig.2

Change in displacement reaction ratio with MBI concentration ($NH_2OH$ 0.10 mol/L)

ELECTROLESS GOLD PLATING SOLUTION

BACKGROUND OF THE INVENTION

1. Technical Field to Which the Invention Pertains

The present invention relates to an electroless gold plating solution for use in formation of a gold plate coating on an industrial electronic component such as a printed wiring board.

2. Prior Art

A printed board has a metal circuit pattern on and/or within the board, and a metal such as copper, which has a low electrical resistance, is used for the circuit. Furthermore, a nickel or nickel alloy barrier metal layer is provided for preventing oxidation and corrosion of the copper circuit and/or preventing migration of gold and, moreover, a gold coating is formed in order to suppress oxidation of nickel, maintain reliability of contacts, improve solderability, etc. When such a circuit is formed, in conventional methods, plating with nickel or a nickel alloy is carried out after forming the copper pattern, and there is then further carried out gold electroplating, autocatalytic gold plating after displacement gold plating, or thick displacement gold plating after the nickel.

With regard to a method for treating copper parts (terminals for connecting external parts or mounting components, through holes, etc.) exposed on the exterior of a printed board, copper wiring to which plating is applied is firstly subjected to pretreatments such as degreasing and etching, then to a palladium catalyst treatment, and to electroless nickel plating to form a barrier metal layer. With regard to a metal used as the barrier metal layer, palladium, platinum, silver, cobalt, or an alloy thereof can be used, as well as nickel or a nickel alloy. In order to prevent diffusion of nickel due to a thermal treatment, a technique of forming a palladium layer on a nickel layer has also been reported (K. Hasegawa et al., Proceeding of the 1997 IEMT/IMC, 230 (1997)).

The nickel, palladium, platinum, silver, cobalt, or an alloy thereof becomes a substrate metal for subsequent gold plating.

After the substrate metal layer is formed, it is covered with a gold coating, thus completing the circuit.

In general, since the gold coating is used for preventing corrosion of the circuit and/or is used as a contact, a coating having a high porosity is undesirable, and a surface having few gaps is required.

With regard to the main gold plating processes that have been carried out so far, there are 1) a method involving a two-stage process in which, after thin gold plating such as displacement gold plating or gold flashing is carried out, autocatalytic electroless gold plating is carried out to increase the coating thickness, 2) a method involving a one-stage process in which a thick coating is formed by thick displacement gold plating, and 3) a method in which a coating is formed by gold electroplating.

The displacement gold plating in 1) involves gold deposition by a galvanic displacement reaction between a substrate metal on the surface to be plated and gold ions and/or gold ion complexes, and the autocatalytic gold plating involves gold deposition by a reducing agent using gold as a catalyst. Examples of 1) are described in JP, A, 2001-185836, etc., and in this case since the gold coating formation process includes two steps, problems such as an increase in cost due simply to an increase in the number of steps occur easily.

In the case of the thick displacement gold plating in 2), it can be carried out in one step, but because of the characteristics of the displacement reaction, an oxide film is easily formed on the substrate metal surface and the porosity tends to become high.

In the case of the gold electroplating in 3), in general, a uniform coating cannot be formed on minute parts, making it difficult to obtain electrical continuity for a complicated circuit, and this method therefore cannot be put into practical use, which is a drawback.

In particular, in the case of the displacement gold plating, since nickel easily diffuses onto the gold plated surface, problems such as a deterioration of bonding performance easily occur (Hyomen Jissou Gijutsu (Surface Mounting Technology, Vol. 5 (11), 52 (1995)).

Furthermore, there is a method involving substrate catalyzed (surface catalyzed) gold plating by a reducing agent using a substrate metal as a catalyst (C. D. Iacovangelo 30 et al., U.S. Pat. No. 4,863,766), but since the substrate metal surface is coated with gold, once gold is coated, the thickness of the gold coating cannot be increased any more, and moreover the method involves a cyanide. The cyanide causes the problem of an increase in the cost of waste water treatment in addition to problems of storage and management and safety problems when carrying out various treatments. Because of this, there has been a desire for the development of an electroless gold plating solution containing no cyanide.

Furthermore, there is a gold plating solution with which gold plating can be carried out directly on gold and nickel using two types of reducing agents in combination, that is, a hydrazine type and a boron base type that have catalytic activity toward gold, nickel, palladium, etc. (J. Electrochem. Soc., Vol. 138, No. 4 (1991) 976–982; U.S. Pat. No. 4,979, 988). This is gold plating by the so-called autocatalytic action and substrate metal catalyzed action; the use of such a gold plating solution cannot give a coating having a specific coating thickness, which can be obtained by displacement reaction gold plating, and the coating obtained cannot be said to have good adhesion. Furthermore, this gold plating solution contains a cyanide.

It is therefore an object of the present invention to provide an electroless gold plating solution that can solve the problems of each of the conventional electroless plating solutions and can form a uniform gold coating having good adhesion and low porosity in one step.

SUMMARY OF THE INVENTION

As a result of an intensive investigation by the present inventors in order to solve the above-mentioned problems, it has been found that the above-mentioned problems can be solved by an electroless gold plating solution containing a reducing agent that is oxidized by gold and a substrate metal, the solution being capable of causing, as appropriate, displacement reaction gold plating, substrate catalyzed gold plating, and autocatalytic gold plating, and the present invention has thus been accomplished.

That is, the present invention relates to an electroless gold plating solution in which an amount of gold deposited by a displacement reaction is at least 15 $\mu g/cm^2$, the electroless gold plating solution containing a reducing agent that is oxidized by gold, and a reducing agent that is of the same type as or is a different type from said reducing agent and is oxidized by a substrate metal.

Furthermore, the present invention relates to the above-mentioned electroless gold plating solution wherein the substrate metal is directly gold plated.

Moreover, the present invention relates to the above-mentioned electroless gold plating solution wherein the coating thickness of gold deposited by action of the reducing agent that is oxidized by the substrate metal is 10% to 70% of the total coating thickness.

Furthermore, the present invention relates to the above-mentioned electroless gold plating solution wherein it contains no cyanide.

Moreover, the present invention relates to the above-mentioned electroless gold plating solution wherein the substrate metal is one type or more than one type of metal chosen from the group consisting of nickel, palladium, platinum, silver, cobalt, and alloys thereof.

Furthermore, the present invention relates to the above-mentioned electroless gold plating solution wherein it further contains one type or more than one type chosen from the group consisting of a gold salt, a complexing agent, a pH buffer, a pH adjusting agent, a stabilizing agent, and a reaction accelerator.

Since the electroless gold plating solution of the present invention is for electroless gold plating, a uniform coating can be formed on minute parts, the porosity can be lower than that formed by thick displacement gold plating, and a gold coating having a thickness of at least 0.2 $\mu$m can be formed in one step. This is because, in the electroless gold plating solution of the present invention, gold plating by a displacement reaction and gold plating by substrate metal and gold catalytic actions proceed simultaneously or successively. For example, by use of the electroless gold plating of the present invention, gold plating strongly bonded to the substrate metal can firstly be formed by a displacement reaction, the substrate can subsequently be coated directly with uniform gold having good adhesion by the catalytic action of the substrate metal without eroding the substrate metal and, furthermore, the thickness of the coating can be increased by gold plating by the catalytic action of the gold.

Moreover, the electroless gold plating solution of the present invention can be used stably without the need of a cyanide while having the catalytic action of the substrate metal and the gold. Furthermore, controlling the reaction of gold by displacement gold plating can appropriately adjust the amount of gold deposited, and can also control erosion of the substrate, which occurs in conventional displacement gold plating.

MODES FOR CARRYING OUT THE INVENTION

The electroless gold plating solution of the present invention is explained in detail below.

Substrate metal is coated using an electroless gold plating solution containing a source of gold, a complexing agent, a pH buffer, a pH adjusting agent, a reducing agent, a stabilizing agent, etc.

Specific examples of the substrate metal include nickel, palladium, platinum, silver, cobalt, and alloys thereof.

The electroless gold plating solution of the present invention is adjusted so that the amount of gold deposited by the displacement reaction is at least 15 $\mu$g/cm$^2$, preferably at least 25 $\mu$g/cm$^2$ when taking into consideration the adhesion of the gold coating to the substrate metal, and more preferably at least 40 $\mu$g/cm$^2$. The solution can be adjusted by appropriately choosing the reducing agent used and the amount thereof added as described below, in addition, appropriately choosing a complexing agent, a stabilizing agent, and a reaction accelerator, and adjusting so that the displacement reaction, substrate catalyzed gold plating, and autocatalytic gold plating can proceed appropriately.

While taking into consideration the uniformity and adhesion of the coating, the adjustment is carried out so that the coating thickness of the gold deposited by the catalytic action of the substrate metal is preferably 10% to 70% of the total coating thickness, and more preferably 20% to 60%.

Specific examples of the source of gold used in the present invention include a soluble gold salt containing no cyanide, such as a gold sulfite salt or a chloroaurate salt, and/or a solution thereof. It is preferable in terms of safety and waste water treatment problems to use a source of gold containing no cyanide. However, when using a composition containing no cyanide, since gold complexes other than cyanide complexes have lower complex stability constants than those of the cyanide complexes and are unstable, they undergo bath decomposition when a strong reducing agent is used, and it is therefore important to choose a reducing agent having appropriate reducing activity. Since the activity of a reducing agent greatly depends on pH and temperature, a suitable pH buffer should be chosen. Furthermore, appropriately choosing and using a compound having an adsorption action on a metal surface, a complexing agent for metal ion masking, etc. as a stabilizing agent for suppressing the bath decomposition enables autocatalytic gold plating to be carried out stably and effectively.

For example, when sodium gold sulfite is used as the source of gold, and taking into consideration the physical properties of the coating deposited, its concentration range is preferably 0.001 to 0.5 M on a gold basis, and more preferably 0.005 to 0.1 M.

Specific examples of the complexing agent include compounds such as sulfite or thiosulfate that can form a complex with monovalent or trivalent gold ions. For example, when sodium sulfite and sodium thiosulfate are used as the complexing agents, the concentrations thereof are preferably in the range of 0.05 to 2.0 M and 0 to 1.0 M respectively, and more preferably 0.1 to 0.8 M and 0.04 to 0.2 M, and the preferable composition ratio thereof is in the range of 1:0.1 to 1. The concentration of the complexing agent depends on the concentration of the gold and is adjusted appropriately while taking into consideration the stability toward gold ions, the bath stability, the solubility, the bath viscosity, etc. Although thiosulfate in particular can increase the deposition rate due to its reducing action, at the same time it makes the bath unstable, and the adhesion is also degraded, and when a large amount is used, there are many disadvantages.

Examples of the pH buffer include phosphates, tetraborates, and borates. When disodium hydrogen phosphate or tetraboric acid is used as the pH buffer, the concentrations thereof are preferably in the range of 0.02 to 1.0 M and 0.001 to 0.12 M, respectively, and more preferably 0.04 to 0.50 M and 0.01 to 0.1 M. They are used singly or in combination, and it should be noted that the buffer activity depends on the pH. Specifically, when the pH is about 8 to 10, the pH of a phosphoric acid buffer is unstable compared with the case of tetraboric acid, and a composition of a mixture of phosphoric acid and tetraboric acid or tetraboric acid alone is preferable. On the other hand, when the pH is about 7, a phosphoric acid buffer is more stable and is therefore used preferentially. Moreover, some types of substrate metal might cause oxidation of the coating, thus greatly degrading the appearance of the plating, and this point should also be noted during use.

Examples of the pH adjusting agent include various types of acids such as sulfuric acid, hydrochloric acid, and phosphoric acid, hydroxide salts such as sodium hydroxide and potassium hydroxide, and, within limits, amines such as $NR_4OH$ (R: hydrogen or alkyl). For example, when a phosphoric acid buffer is used as the pH adjusting agent, phosphoric acid and sodium hydroxide or potassium hydroxide are preferably used.

The pH is preferably in the range of 5 to 11, and more preferably 6.5 to 9.5, depending on the composition.

With regard to reducing agents that are oxidized by the substrate metal and gold, general reducing agents can be used. In addition to sulfite and thiosulfate, which are used also as the complexing agent, there can be cited as examples hydroxylamine, a salt thereof, a derivative thereof, hydrazine, an amineborane compound such as dimethylamineborane, a borohydride compound such as sodium borohydride, a saccharide such as glucose, and a hypophosphite, which may be used singly or in combination. Furthermore, any compound can be used as long as it is determined by the Nernst equation as being capable of reducing and depositing gold from gold ions or a gold complex, but the compound is used while taking into consideration the reactivity toward other bath components, the bath stability, etc. Although it is possible to use a reducing agent that can act on both gold and the substrate metal, since the actions with respect to gold and the substrate metal differ depending on conditions such as pH, temperature, and the complexing agent, in such a case it is appropriate to use more than one type of reducing agent. For example, hydrazine, sodium hypophosphite, hydroxylamine hydrochloride, etc. can function as a reducing agent for both the substrate metal (in the case of Ni) and gold under conditions of high pH, but under low pH they can function as a reducing agent only for Ni and not for gold. Furthermore, among these reducing agents, some such as hydrazine can adversely affect humans, and it is therefore necessary to choose and use them according to the purpose, the application environment, the type of substrate metal, etc. For example, when hydroxylamine hydrochloride is used as the reducing agent, the concentration thereof is preferably in the range of up to and including 1.0 M, and more preferably 0.005 to 0.3 M. The amount of reducing agent depends on the accelerator and the stabilizing agent; when the amount is small, although a plating reaction proceeds, the proportion of the displacement reaction becomes high, and the problem of substrate erosion easily occurs. When the amount is large, although a plating reaction proceeds, the catalytic action becomes strong, thus making the bath unstable, and the amount used is therefore adjusted appropriately.

In addition, a compound containing the —SH structure such as 2-mercaptobenzothiazole (MBT), 2-mercaptobenzoimidazole (MBI), or mercaptoacetic acid can be used as a stabilizing agent and/or an autocatalytic reaction inhibitor, but since some thereof might react with a reducing agent or another component depending on the combination, thus destabilizing the bath, it should be chosen carefully. It is also possible to use a water-soluble cyclic compound containing a nitrogen atom such as 1,10-phenanthroline, 2,2'-bipyridyl, cupferron, or cytosine, but since some thereof may suppress formation of a gold coating to a great extent, when using them it is necessary to control the amount thereof added. When MBT or MBI is used as the stabilizing agent, the concentration thereof is preferably in the range of up to and including 50 ppm, and more preferably up to and including 20 ppm.

With regard to the reaction accelerator used in the present invention, ethylenediamine tetraacetic acid (EDTA), ethylenediamine (En), salts of nitrilotriacetic acid (NTA) and iminodiacetic acid (IDA), an amino acid such as glycine, or an oxocarboxylic acid such as tartaric acid, malic acid, or citric acid, which are generally used as complexing agents, can be added, but since they also accelerate the displacement reaction and might cause the problems of degradation of physical properties of the coating and erosion of the substrate, when using them it is necessary to control the amount thereof added. When glycine is used as the accelerator, the concentration thereof is preferably in the range of, for example, up to and including 0.5 M, and more preferably up to and including 0.2 M. It should be noted that since these accelerators also accelerate the displacement reaction at the same time, the amount thereof added must be adjusted according to the action of the reducing agent and the stabilizing agent.

With regard to the temperature at which it is used, although it depends on the reducing agent, it can be used in the range of 30° C. to 90° C., and preferably 40° C. to 70° C.

With regard to other additives, a crystal particle shape adjusting agent, a brightening agent, etc. can be used in an appropriate concentration range. Other additives can also be used as long as the composition can satisfy the above-mentioned conditions.

EXAMPLES

The electroless gold plating solution of the present invention is explained further in detail below by reference to examples and comparative examples, but the present invention is not limited thereby.

The coating thickness, the displacement reaction ratio (coating thickness obtained by the displacement reaction/total coating thickness), and the adhesion of the gold coating obtained using the electroless gold plating solution of the present invention were evaluated.

The coating thickness was measured using an X-ray fluorescence coating thickness meter manufactured by SII, and the displacement reaction ratio was calculated on the basis of the amount of Ni that had eluted into the bath during a plating operation. The adhesion was evaluated in a tape test according to JIS H8504 'Methods for adhesion test for metallic coatings'. The porosity was measured by a gelatin constant potential method (F. V. Bedetti and R. V. Chiarenzelli, Plating 53, 305, 1966). A copper plate was used as a plating sample, and this was subjected to Ni alloy plating by the procedure below and used for testing.

Copper Plate Pretreatment

Degreasing (Acid Clean 115, manufactured by Okuno Chemical Industries Co., Ltd.) 60° C., 5 min→etching (sodium persulfate 150 g/L, 98% sulfuric acid 2 mL/L) 1 min→immersion in 10 mL/L solution of 98% sulfuric acid 30 sec→immersion in 10 mL/L solution of 30% hydrochloric acid 30 sec→Pd catalyst formation (ICP Accera, manufactured by Okuno Chemical Industries Co., Ltd.) 30 sec→electroless Ni—P plating (ICP Nicoron GM, manufactured by Okuno Chemical Industries Co., Ltd., P content 6% to 8%, about 5 μm)→immersion in 0.5 mol/L hypophosphorous acid solution→gold plating

Example 1

A Ni—P coating was formed on a copper plate by the above-mentioned procedure using ICP Nicoron GM manufactured by Okuno Chemical Industries Co., Ltd. and then subjected to electroless gold plating using solution No. 1 in Table 1.

As a result of immersion for 1 hr. with stirring at 60° C., a bright yellow semigloss gold coating having a thickness of 0.04 μm was obtained. The coating thus obtained did not peel off in a tape test, thus showing good adhesion, and almost no pores were observed. The displacement reaction ratio based on the amount of Ni eluted was 27%. The Au wire bonding strength of at least 10 gf was excellent.

Example 2

A Ni—P coating was formed on a copper plate by the above-mentioned procedure using ICP Nicoron GM manufactured by Okuno Chemical Industries Co., Ltd. and then subjected to electroless gold plating using solution No. 2 in Table 1.

As a result of immersion for 1 hr. with stirring at 60° C., a bright yellow semigloss gold coating having a thickness of 0.68 μm was obtained. The coating thus obtained did not peel off in a tape test, thus showing good adhesion, and no pores were observed. The displacement reaction ratio based on the amount of Ni eluted was 1%.

Example 3

A Ni—P coating was formed on a copper plate by the above-mentioned procedure using ICP Nicoron GM manufactured by Okuno Chemical Industries Co., Ltd. and then subjected to electroless gold plating using solution No. 3 in Table 1.

As a result of immersion for 1 hr. with stirring at 60° C., a bright yellow semigloss gold coating having a thickness of 0.08 μm was obtained. The coating thus obtained showed good adhesion in a tape test, and almost no pores were observed. The displacement reaction ratio based on the amount of Ni eluted was 15%.

Example 4

Pretreatments up to Pd catalyst formation were carried out on a copper plate by the above-mentioned procedure, an electroless Ni—B coating was then formed at a thickness of 3 μm, and electroless gold plating was subsequently carried out using solution No. 4 in Table 1.

As a result of immersion for 1 hr. with stirring at 60° C., a bright yellow semigloss gold coating having a thickness of 0.14 μm was obtained. The coating thus obtained showed good adhesion in a tape test, and almost no pores were observed. The displacement reaction ratio based on the amount of Ni eluted was 9%. Plating was also carried out on an Ni—P coating using solution No. 4, an evaluation was carried out, and almost the same results were obtained.

Example 5

A Ni—P coating was formed on a copper plate by the above-mentioned procedure using ICP Nicoron GM manufactured by Okuno Chemical Industries Co., Ltd. and then subjected to electroless gold plating using solution No. 5 in Table 1.

As a result of immersion for 1 hr. with stirring at 60° C., a bright yellow semigloss gold coating having a thickness of 0.41 μm was obtained. The coating thus obtained showed good adhesion in a tape test, and almost no pores were observed. The displacement reaction ratio based on the amount of Ni eluted was 3%.

Example 6

A Ni—P coating was formed on a copper plate by the above-mentioned procedure using ICP Nicoron GM manufactured by Okuno Chemical Industries Co., Ltd. and then subjected to electroless gold plating using solution No. 6 in Table 1.

As a result of immersion for 1 hr. with stirring at 60° C., a bright yellow semigloss gold coating having a thickness of 0.09 μm was obtained. The coating thus obtained showed good adhesion in a tape test. The displacement reaction ratio based on the amount of Ni eluted was 22%.

Example 7

A Ni—P coating was formed on a copper plate by the above-mentioned procedure using ICP Nicoron GM manufactured by Okuno Chemical Industries Co., Ltd. and then subjected to electroless gold plating using solution No. 7 in Table 1.

As a result of immersion for 1 hr. with stirring at 60° C., a bright yellow semigloss gold coating having a thickness of 0.40 μm was obtained. The coating thus obtained showed good adhesion in a tape test and, although pores were observed over the whole deposition surface of a displacement gold plating of Comparative Example 2, there were far fewer pores in the present example. The displacement reaction ratio based on the amount of Ni eluted was 68%.

Example 8

Pretreatments up to Pd catalyst formation were carried out on a copper plate by the above-mentioned procedure, an electroless Ni—B coating was then formed at a thickness of 3 μm, and electroless gold plating was subsequently carried out using solution No. 8 in Table 1.

As a result of immersion for 1 hr. with stirring at 60° C., a bright yellow semigloss gold coating having a thickness of 0.15 μm was obtained. The coating thus obtained showed good adhesion in a tape test, and almost no pores were observed. The displacement reaction ratio based on the amount of Ni eluted was 37%.

Example 9

A Ni—P coating was formed on a copper plate by the above-mentioned procedure using ICP Nicoron GM manufactured by Okuno Chemical Industries Co., Ltd. and then subjected to electroless gold plating using solution No. 9 in Table 1.

As a result of immersion for 1 hr. with stirring at 60° C., a bright yellow semigloss gold coating having a thickness of 1.41 μm was obtained. The coating thus obtained showed good adhesion in a tape test and, although pores were observed over the whole deposition surface of the displacement gold plating of Comparative Example 2, there were far fewer pores in the present example. The displacement reaction ratio based on the amount of Ni eluted was 31%.

Example 10

A Ni—P coating was formed on a copper plate by the above-mentioned procedure using ICP Nicoron GM manufactured by Okuno Chemical Industries Co., Ltd. and then subjected to electroless gold plating using solution No. 10 in Table 1.

As a result of immersion for 1 hr. with stirring at 60° C., a bright yellow semigloss gold coating having a thickness of 0.21 μm was obtained. The coating thus obtained showed good adhesion in a tape test and, although pores were observed over the whole deposition surface of the displacement gold plating of Comparative Example 2, there were far fewer pores in the present example. The displacement reaction ratio based on the amount of Ni eluted was 7%.

Example 11

A Ni—P coating was formed on a copper plate by the above-mentioned procedure using ICP Nicoron GM manufactured by Okuno Chemical Industries Co., Ltd. and then subjected to electroless gold plating using solution No. 11 in Table 1.

As a result of immersion for 1 hr. with stirring at 60° C., a bright yellow semigloss gold coating having a thickness of 0.21 μm was obtained. The coating thus obtained showed good adhesion in a tape test, and almost no pores were observed. The displacement reaction ratio based on the amount of Ni eluted was 5%.

Example 12

A Ni plate was subjected to electroless gold plating using solution No. 12 in Table 1.

As a result of immersion for 1 hr. with stirring at 60° C., a bright yellow semigloss gold coating having a thickness of 0.47 μm was obtained. The coating thus obtained showed good adhesion in a tape test, and almost no pores were observed. The displacement reaction ratio based on the amount of Ni eluted was 3%.

Example 13

A Ni—P coating was formed on a copper plate by the above-mentioned procedure using ICP Nicoron GM manufactured by Okuno Chemical Industries Co., Ltd. and then subjected to electroless gold plating using solution No. 13 in Table 1.

As a result of immersion for 1 hr. with stirring at 60° C., a bright yellow semigloss gold coating having a thickness of 0.35 μm was obtained. The coating thus obtained showed good adhesion in a tape test and, although pores were observed over the whole deposition surface of the displacement gold plating of Comparative Example 2, there were far fewer pores in the present example. The displacement reaction ratio based on the amount of Ni eluted was 70%.

Example 14

A Ni—P coating was formed on a copper plate by the above-mentioned procedure using ICP Nicoron GM manufactured by Okuno Chemical Industries Co., Ltd. and then subjected to electroless gold plating using solution No. 14 in Table 1.

As a result of immersion for 1 hr. with stirring at 60° C., a bright yellow semigloss gold coating having a thickness of 1.19 μm was obtained. The coating thus obtained showed good adhesion in a tape test and, although pores were observed over the whole deposition surface of the displacement gold plating of Comparative Example 2, there were far fewer pores in the present example. The displacement reaction ratio based on the amount of Ni eluted was 23%.

Example 15

Figure 1:
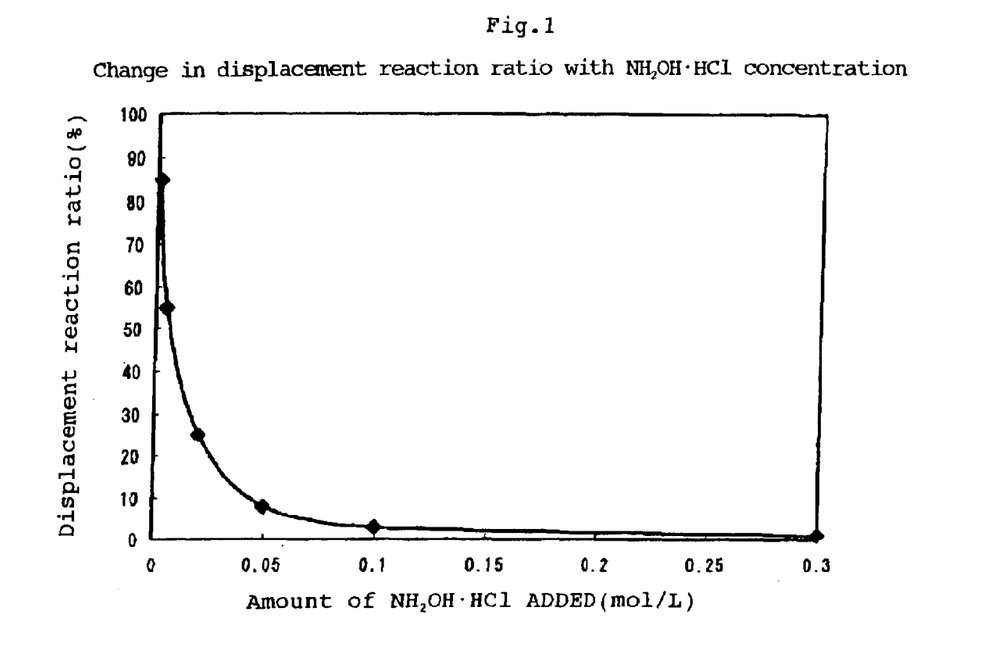
FIG. 1 is a graph showing how the displacement reaction ratio changes with the NH$_2$OH.HCl concentration.

When the total coating thickness is defined as the total of the coating thicknesses obtained by three actions, that is, substrate catalyzed, displacement, and autocatalytic actions, the displacement reaction ratio (=coating thickness by the displacement reaction/total coating thickness) can be controlled by various types of additives. After forming a Ni—P coating on a copper plate by the above-mentioned procedure using ICP Nicoron GM manufactured by Okuno Chemical Industries Co., Ltd., the displacement reaction ratio was varied using solution No. 15 in Table 1 in which the concentration of hydroxylamine hydrochloride was changed successively, and the results are given in FIG. 1. It was found that the displacement reaction ratio decreased as the amount of hydroxylamine hydrochloride added increased. The ratio was 80% or above at a concentration of 0.001 mol/L or less and 10% or less at a concentration of 0.05 mol/L or above, and it could thus be controlled over a wide range.

Example 16

Figure 2:
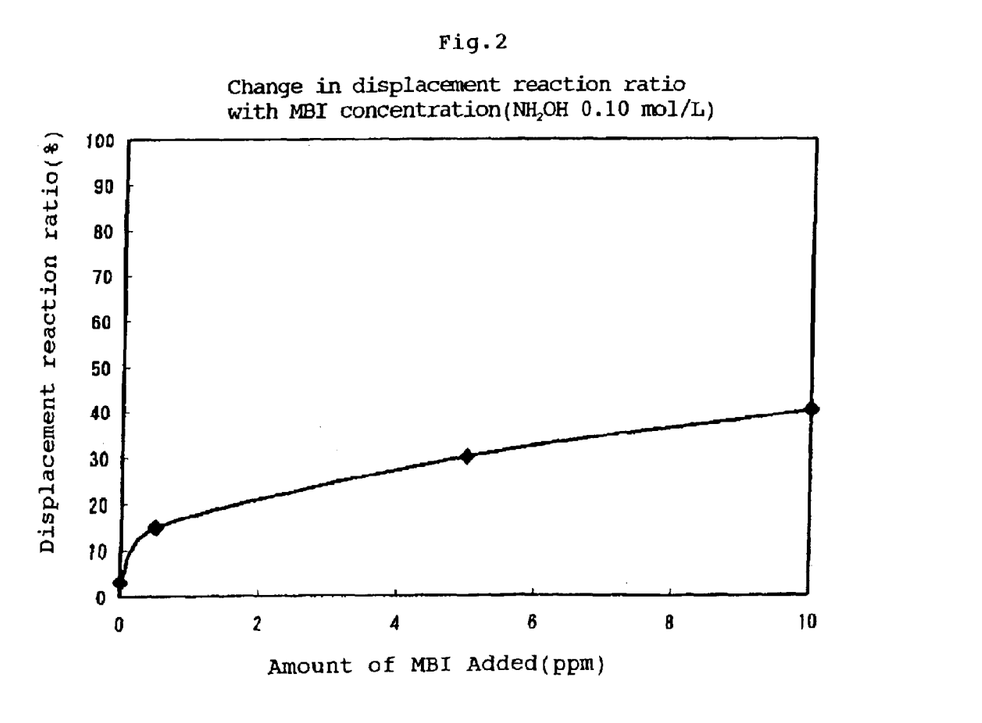
FIG. 2 is a graph showing how the displacement reaction ratio changes with the MBI concentration.

This is an example of control of the displacement reaction ratio as in Example 15. After a Ni—P coating was formed on a copper plate by the above-mentioned procedure using ICP Nicoron GM manufactured by Okuno Chemical Industries Co., Ltd., the displacement reaction ratio was varied using solution No. 16 in Table 1 in which the concentration of MBI was changed successively, and the results are given in FIG. 2. It was found that the displacement reaction ratio increased as the amount of MBI added increased. The displacement reaction ratio was 10% or less when no MBI was added, but it was about 40% when the amount added was 10 ppm.

Example 17

A Ni—P coating was formed on a copper plate by the above-mentioned procedure using ICP Nicoron GM manufactured by Okuno Chemical Industries Co., Ltd. and then subjected to electroless gold plating using solution No. 17 in Table 1.

As a result of immersion for 1 hr. with stirring at 60° C., a bright yellow semigloss gold coating having a thickness of 0.12 μm was obtained. The coating thus obtained showed good adhesion in a tape test. The displacement reaction ratio based on the amount of Ni eluted was 23%, and the autocatalytic reaction ratio based on a coating thickness of 0.05 μm obtained by immersing a gold plate in a bath with the same composition was 42%. The substrate catalyzed reaction ratio calculated using the above figures was 35%.

Example 18

A Ni—P coating was formed on a copper plate by the above-mentioned procedure using ICP Nicoron GM manufactured by Okuno Chemical Industries Co., Ltd. and then subjected to electroless gold plating using solution No. 18 in Table 1.

As a result of immersion for 1 hr. with stirring at 60° C., a bright yellow semigloss gold coating having a thickness of 0.13 μm was obtained. The coating thus obtained showed good adhesion in a tape test. The displacement reaction ratio based on the amount of Ni eluted was 18%, and the autocatalytic reaction ratio based on a coating thickness of 0.02 μm obtained by immersing a gold plate in a bath with the same composition was 15%. The substrate catalyzed reaction ratio calculated using the above figures was 67%.

Example 19

A Ni—P coating was formed on a copper plate by the above-mentioned procedure using ICP Nicoron GM manufactured by Okuno Chemical Industries Co., Ltd. and then subjected to electroless gold plating using solution No. 19 in Table 1.

As a result of immersion for 1 hr. with stirring at 60° C., a bright yellow semigloss gold coating having a thickness of 0.07 μm was obtained. The coating thus obtained showed good adhesion in a tape test. The displacement reaction ratio based on the amount of Ni eluted was 31%, and the autocatalytic reaction ratio based on a coating thickness of 0.03 μm obtained by immersing a gold plate in a bath with the same composition was 42%. The substrate catalyzed reaction ratio calculated using the above figures was 28%.

Comparative Example 1

As a comparison, a Ni—P plate coating was formed on a copper plate by the above-mentioned procedure using ICP Nicoron GM manufactured by Okuno Chemical Industries Co., Ltd. and then subjected to direct gold plating by electroless autocatalytic gold plating of the composition below, which is known from Japanese Patent No. 3148427. Autocatalytic gold plating is usually carried out subsequent to displacement gold, and the present bath can give a good thick gold coating if it is carried out after the displacement gold. EMBT in the composition denotes 6-ethoxy-2-mercaptobenzothiazole.

| | |
|---|---|
| Sodium chloroaurate | 2 g/L as Au |
| Sodium sulfite | 12.5 g/L |
| Sodium thiosulfate | 25 g/L |
| Disodium hydrogen phosphate | 9 g/L |
| Sodium dihydrogen phosphate | 3 g/L |
| Sodium L-ascorbate | 40 g/L |
| EMBT | 2 ppm |
| pH | 7.0 |
| Bath temperature | 60° C. |

As a result of immersion for 1 hr. with stirring at 60° C., a bright yellow semigloss gold coating having a thickness of 0.84 μm was obtained. When the coating thus obtained was evaluated by the tape test, the whole surface peeled off, and no adhesion could be obtained. This confirmed the effectiveness of the electroless gold plating solution of the present invention that can give good adhesion even when a Ni—P substrate is directly plated.

Comparative Example 2

A Ni—P plate coating was formed on a copper plate by the above-mentioned procedure using ICP Nicoron GM manufactured by Okuno Chemical Industries Co., Ltd. and then subjected to a displacement gold plating treatment using the composition below, which is known. The present bath can give a good gold coating if an appropriate autocatalytic gold plating is carried out subsequent to the displacement gold.

| | |
|---|---|
| Sodium gold sulfite | 10 g/L as Au |
| Sodium sulfite | 68 g/L |
| Citric acid | 26 g/L |
| pH | 7.0 |
| Bath temperature | 85° C. |

As a result of immersion for 1 hr. with stirring at 85° C., a bright yellow gloss gold coating having a thickness of 0.05 μm was obtained. The coating thus obtained showed good adhesion in a tape test, but a large number of pores were observed. This confirmed the effectiveness of the electroless gold plating solution of the present invention that can give a coating with almost no pores even when a Ni—P substrate is plated.

| | | | Example | | | | | | |
|---|---|---|---|---|---|---|---|---|---|
| | | | 1 | 2 | 3 | 4 | 5 | 6 | 7 |
| | Substrate | | Ni—P | Ni—P | Ni—P | Ni—P, Ni—B | Ni—P | Ni—P | Ni—P |
| Source of gold | Sodium gold sulfite | (mol/L) | 0.01 as Au | 0.01 as Au | 0.01 as Au | 0.01 as Au | 0.01 as Au | 0.01 as Au | 0.01 as Au |
| | Sodium chloroaurate | (mol/L) | — | — | — | — | — | — | — |
| Complexing agent (also reducing agent) | Sodium sulfite | (mol/L) | 0.32 | 0.32 | 0.32 | 0.32 | 0.32 | 0.64 | 0.32 |
| | Sodium thiosulfate | (mol/L) | 0.08 | 0.08 | 0.08 | 0.08 | 0.08 | 0.16 | 0.08 |
| Buffer | Potassium tetraborate | (mol/L) | 0.05 | 0.05 | 0.05 | 0.05 | — | — | — |
| | Disodium hydrogen phosphate | (mol/L) | — | — | — | — | 0.32 | 0.32 | 0.32 |
| Reducing agent | Hydroxylamine hydrochloride | (mol/L) | 0.10 | 0.30 | 0.10 | 0.05 | 0.10 | 0.10 | 0.10 |
| | N-Methyl-hydroxylamine | (mol/L) | — | — | — | — | — | — | — |
| Stabilizing agent | MBT | (ppm) | — | — | — | — | — | 10 | 10 |
| | MBI | (ppm) | 5 | — | 0.5 | — | — | — | — |

-continued

| | | | | | | | | | |
|---|---|---|---|---|---|---|---|---|---|
| Accelerator | Cupferron | (ppm) | — | — | — | — | — | — | — |
| | Cytosine | (ppm) | — | — | — | — | — | — | — |
| | Glycine | (mol/L) | — | — | — | — | — | — | 0.10 |
| | Tartaric acid KNa | (mol/L) | — | — | — | — | — | — | — |
| | IDA | (mol/L) | — | — | — | — | — | — | — |
| | pH | | 9 | 9 | 9 | 9 | 9 | 9 | 9 |
| | pH adjustment | | NaOH or H$_2$SO$_4$ | NaOH or H$_2$SO$_4$ | NaOH or H$_2$SO$_4$ | NaOH or H$_2$SO$_4$ | NaOH or H$_2$SO$_4$ | NaOH or H$_3$PO$_4$ | NaOH or H$_3$PO$_4$ |
| | Bath temperature | | 60° C. | 60° C. | 60° C. | 60° C. | 60° C. | 60° C. | 60° C. |
| | Plating time | (min) | 60 | 60 | 60 | 60 | 60 | 60 | 60 |
| | Coating thickness | (μm) | 0.04 | 0.68 | 0.08 | 0.14 | 0.41 | 0.09 | 0.40 |
| | Displacement reaction ratio | (%) | 27 | 1 | 15 | 9 | 3 | 22 | 68 |
| | Amount of Ni eluted (per unit area) | (μg/cm$^2$) | 3.2 | 2.4 | 3.5 | 3.5 | 3.7 | 5.8 | 76.1 |
| | Amount of Au deposited by displacement reaction | (μg/cm$^2$) | 21 | 16 | 23 | 23 | 25 | 39 | 524 |
| | Average displacement reaction coating thickness | (μm) | 0.011 | 0.008 | 0.012 | 0.012 | 0.013 | 0.020 | 0.272 |
| | Notes | | 5 ppm MBI added | NH$_2$OH increased | 0.5 ppm MBI | Standard conditions | Buffer changed | Conc. of sulfite and thiosulfite changed, MBT added | MBT, glycine |

| | | | Example | | | | | |
|---|---|---|---|---|---|---|---|---|
| | | | 8 | 9 | 10 | 11 | 12 | 13 |
| | Substrate | | Ni—B | Ni—P | Ni—P | Ni—P | Ni | Ni—P |
| Source of gold | Sodium gold sulfite | (mol/L) | — | 0.01 as Au | 0.01 as Au | 0.01 as Au | — | 0.01 as Au |
| | Sodium chloroaurate | (mol/L) | 0.01 as Au | — | — | — | 0.01 as Au | — |
| Complexing agent (also reducing agent) | Sodium sulfite | (mol/L) | 0.32 | 0.32 | 0.32 | 0.32 | 0.32 | 0.32 |
| | Sodium thiosulfate | (mol/L) | 0.08 | 0.10 | 0.08 | 0.08 | 0.08 | 0.10 |
| Buffer | Potassium tetraborate | (mol/L) | — | — | 0.05 | 0.05 | — | — |
| | Disodium hydrogen phosphate | (mol/L) | 0.32 | 0.09 | — | — | 0.08 | 0.09 |
| Reducing agent | Hydroxylamine hydrochloride | (mol/L) | 0.10 | — | 0.05 | 0.05 | — | — |
| | N-Methyl-hydroxylamine | (mol/L) | — | — | — | — | 0.10 | — |
| Stabilizing agent | MBT | (ppm) | — | — | — | — | — | — |
| | MBI | (ppm) | — | — | — | — | — | — |
| | Cupferron | (ppm) | — | — | 100 | — | — | — |
| | Cytosine | (ppm) | — | — | — | 1000 | — | — |
| Accelerator | Glycine | (mol/L) | — | 0.10 | — | — | — | — |
| | Tartaric acid KNa | (mol/L) | — | — | — | — | — | 0.10 |
| | IDA | (mol/L) | — | — | — | — | — | — |
| | pH | | 8 | 7.2 | 9 | 9 | 9 | 7.2 |
| | pH adjustment | | NaOH or H$_3$PO$_4$ | NaOH or H$_3$PO$_4$ | NaOH or H$_2$SO$_4$ | NaOH or H$_2$SO$_4$ | NaOH or H$_3$PO$_4$ | NaOH or H$_3$PO$_4$ |
| | Bath temperature | | 60° C. | 60° C. | 60° C. | 60° C. | 60° C. | 60° C. |
| | Plating time | (min) | 60 | 60 | 60 | 60 | 60 | 60 |
| | Coating thickness | (μm) | 0.15 | 1.41 | 0.21 | 0.21 | 0.47 | 0.35 |
| | Displacement reaction | (%) | 37 | 31 | 7 | 5 | 3 | 70 |

-continued

|  |  |  |  |  |  |  |  |
|---|---|---|---|---|---|---|---|
| ratio |  |  |  |  |  |  |  |
| Amount of Ni eluted (per unit area) | ($\mu$g/cm$^2$) | 16.1 | 124.1 | 4.2 | 3.2 | 4.3 | 70.1 |
| Amount of Au deposited by displacement reaction | ($\mu$g/cm$^2$) | 108 | 833 | 28 | 22 | 29 | 471 |
| Average displacement reaction coating thickness | ($\mu$m) | 0.056 | 0.432 | 0.014 | 0.011 | 0.015 | 0.244 |
| Notes |  | Gold source, pH changed | pH changed glycine added, no NH$_2$OH | Cupferon added | Cytosine added | Reducing agent changed | pH changed tartaric acid added, no NH$_2$OH |

|  |  |  | Example | | | | | |
|---|---|---|---|---|---|---|---|---|
|  |  |  | 14 | 15 | 16 | 17 | 18 | 19 |
|  | Substrate |  | Ni—P | Ni—P | Ni—P | Ni—P | Ni | Ni—P |
| Source of gold | Sodium gold sulfite | (mol/L) | 0.01 as Au | 0.01 as Au | 0.01 as Au | 0.02 as Au | 0.02 as Au | 0.04 as Au |
|  | Sodium chloroaurate | (mol/L) | — | — | — | — | — | — |
| Complexing agent (also reducing agent) | Sodium sulfite | (mol/L) | 0.32 | 0.32 | 0.32 | 0.32 | 0.32 | 0.32 |
|  | Sodium thiosulfate | (mol/L) | 0.10 | 0.08 | 0.08 | 0.08 | 0.08 | 0.08 |
| Buffer | Potassium tetraborate | (mol/L) | — | 0.05 | 0.05 | — | — | — |
|  | Disodium hydrogen phosphate | (mol/L) | 0.09 | — | — | 0.09 | 0.09 | 0.09 |
| Reducing agent | Hydroxylamine hydrochloride | (mol/L) | — | 0 to 0.30 | 0.10 | 0.10 | 0.10 | 0.10 |
|  | N-Methyl-hydroxylamine | (mol/L) | — | — | — | — | — | — |
| Stabilizing agent | MBT | (ppm) | — | — | — | 5 | — | 10 |
|  | MBI | (ppm) | — | — | 0 to 10 | — | 10 | — |
|  | Cupferron | (ppm) | — | — | — | — | — | — |
|  | Cytosine | (ppm) | — | — | — | — | — | — |
| Accelerator | Glycine | (mol/L) | — | — | — | — | — | — |
|  | Tartaric acid KNa | (mol/L) | — | — | — | — | — | — |
|  | IDA | (mol/L) | 0.10 | — | — | — | — | — |
|  | pH |  | 7.2 | 9 | 9 | 9 | 9 | 9 |
|  | pH adjustment |  | NaOH or H$_3$PO$_4$ | NaOH or H$_2$SO$_4$ | NaOH or H$_2$SO$_4$ | NaOH or H$_3$PO$_4$ | NaOH or H$_3$PO$_4$ | NaOH or H$_3$PO$_4$ |
|  | Bath temperature |  | 60° C. | 60° C. | 60° C. | 60° C. | 60° C. | 60° C. |
|  | Plating time | (min) | 60 | 60 | 60 | 60 | 60 | 60 |
|  | Coating thickness | ($\mu$m) | 1.19 |  |  | 0.12 | 0.13 | 0.07 |
|  | Displacement reaction ratio | (%) | 23 |  |  | 23 | 18 | 31 |
|  | Amount of Ni eluted (per unit area) | ($\mu$g/cm$^2$) | 76.8 |  |  | 7.7 | 6.9 | 6.3 |
|  | Amount of Au deposited by displacement reaction | ($\mu$g/cm$^2$) | 529 |  |  | 52 | 46 | 42 |
|  | Average displacement reaction coating thickness | ($\mu$m) | 0.274 |  |  | 0.027 | 0.024 | 0.022 |
|  | Notes |  | pH changed, IDA added, no NH$_2$OH | Control of displacement reaction ratio by NH$_2$OH.HCl | Control of displacement reaction ratio by MBI | Example of calculating substrate catalyzed reaction ratio | Example of calculating substrate catalyzed reaction ratio | Example of calculating substrate catalyzed reaction ratio |

EFFECTS OF THE INVENTION

As hereinbefore described, the electroless gold plating solution of the present invention can form, on a substrate metal in one step, a gold coating having fewer pores and better adhesion than a gold coating obtained by conventional gold plating.

Those skilled in the art will recognize, or be able to ascertain using no more than routine experimentation, many equivalents to the specific embodiments of the invention described herein. Such equivalents are intended to be encompassed by the following claims. All references disclosed herein are incorporated by reference.

What is claimed is:

1. An electroless gold plating solution in which an amount of gold deposited by a displacement reaction is at least 15 $\mu g/cm^2$, said electroless gold plating solution comprising a reducing agent that is oxidized by gold, and a reducing agent that is of the same type as or is a different type from said reducing agent and is oxidized by a substrate metal, and a complexing agent, wherein said electroless gold plating solution contains no cyanide, said reducing agent is one type or more than one type of compound chosen from the group consisting of sulfite, thiosulfate, hydroxylamine, a salt thereof, a derivative thereof, hydrazine, dimethylamineborane, sodium borohydride, glucose, and hypophosphite, and said complexing agent is sulfite and/or thiosulfate.

2. The electroless gold plating solution according to claim 1 wherein the substrate metal is directly gold plated.

3. The electroless gold plating solution according to claim 1 wherein the coating thickness of gold deposited by action of the reducing agent that is oxidized by the substrate metal is 10% to 70% of the total coating thickness.

4. The electroless gold plating solution according to claim 1 wherein the substrate metal is one type or more than one type of metal chosen from the group consisting of nickel, palladium, platinum, silver, cobalt, and alloys thereof.

5. The electroless gold plating solution according to claim 1, said electroless gold plating solution further comprising one type or more than one type of member chosen from the group consisting of a gold salt, a pH buffer, a pH adjusting agent, a stabilizing agent, and a reaction accelerator.

6. The electroless gold plating solution according to claim 5, wherein the gold salt is gold sulfite salt and/or chloroaurate salt.

7. The electroless gold plating solution according to claim 5, wherein the pH buffer is one type or more than one type of compound chosen from the group consisting of phosphate, tetraborate, and borate.

8. The electroless gold plating solution according to claim 6, wherein the pH adjusting agent is one type or more than one type of compound chosen from the group consisting of sulfuric acid, hydrochloric acid, phosphoric acid, sodium hydroxide, potassium hydroxide, and amines.

9. The electroless gold plating solution according to claim 5, wherein the stabilizing agent is one type or more than one type of compound chosen from the group consisting of 2-mercaptobenzothiazole, 2-mercaptobenzoimidazole, mercaptoacetic acid, 1,10-phenanthroline, 2,2'-bipyridyl, cupferron, and cytosine.

10. The electroless gold plating solution according to claim 5, wherein the reaction accelerator is one type or more than one type of compound chosen from the group consisting of ethylenediamine tetraacetic acid, ethylenediamine, nitrilotriacetic acid, iminodiacetic acid, glycine, tartaric acid, malic acid, citric acid, and salts thereof.

11. A method of electroless gold plating in one step wherein the object of plating is immersed in the electroless gold plating solution according to claim 1.

* * * * *